United States Patent [19]

Shimada et al.

[11] Patent Number: 5,050,190
[45] Date of Patent: Sep. 17, 1991

[54] SIGNAL DETECTION CIRCUIT NOT AFFECTED BY MINUTE VOLTAGE FLUCTUATIONS CONTAINED IN INPUT SIGNAL AND OPERATION METHOD THEREFOR

[75] Inventors: Hiromi Shimada; Harufusa Kondoh, both of Hyogo, Japan

[73] Assignee: Mitsubishi Denki Kabushiki Kaisha, Tokyo, Japan

[21] Appl. No.: 444,213

[22] Filed: Dec. 1, 1989

[30] Foreign Application Priority Data

Dec. 14, 1988 [JP] Japan .................. 63-316909

[51] Int. Cl.⁵ .................. H04L 25/06; H03K 5/22
[52] U.S. Cl. .................. 375/76; 307/356; 328/149
[58] Field of Search .................. 375/76; 307/356–358, 307/354; 329/311; 328/271, 149, 115, 116

[56] References Cited

U.S. PATENT DOCUMENTS 4,027,152  5/1977  Brown et al. .................. 455/608
4,157,509  6/1979  Zielinski .................. 375/76 X
4,584,690  4/1986  Cafiero et al. .................. 375/76

OTHER PUBLICATIONS

Gillingham et al., "An ISDN-Interface Transceiver with Analog Timing Recovery", 1988 IEEE International Solid-State Circuits Conference, Digest of Technical Papers, pp. 108–109, Feb. 18, 1988.

"Part C of the Report of the Geneva Meeting (Jul. 8–15, 1986) of Working Party XV III/3 (User-Network Interfaces, Layer 1), As Approved by Study Group XV III".

Primary Examiner—Benedict V. Safourek
Assistant Examiner—Tesfaldet Bocure
Attorney, Agent, or Firm—Lowe, Price, LeBlanc and Becker

[57] ABSTRACT

A reference voltage generating circuit (9) for supplying a reference voltage (Vag±ΔV) is connected to a peak hold or tracking circuit (34). The setting value of the voltage (ΔV) is determined to a value exceeding the minute voltage fluctuations, such as back pulses or noises, occasionally contained in the input signal (Vin), by the voltage division in the generating circuit (9). Therefore, in response to the input signal Vin in accordance with the alternate mark inversion, exact data which is not influenced by the minute voltage fluctuation can be detected by the data detector (33).

9 Claims, 6 Drawing Sheets

9: REFERENCE VOLTAGE GENERATING CIRCUIT    33: DATA DETECTOR    34: PEAK HOLD CIRCUIT

33: DATA DETECTOR
34: PEAK HOLD CIRCUIT
9: REFERENCE VOLTAGE GENERATING CIRCUIT $V_{in} - V_{th1}$

100 : NETWORK TERMINATION UNIT

AMI CODE (ALTERNATE MARK INVERSION)

SIGNAL DETECTION CIRCUIT NOT AFFECTED BY MINUTE VOLTAGE FLUCTUATIONS CONTAINED IN INPUT SIGNAL AND OPERATION METHOD THEREFOR

BACKGROUND OF THE INVENTION

1. Field of the Invention

This invention relates in general to a signal detection circuit and, more particularly, to a signal detection circuit the output voltage of which is not affected by minute voltage fluctuations contained in the input signals. The present invention has a particular applicability to a signal detection circuit for input signals encoded in accordance with Alternate Mark Inversion.

2. Description of the Background Art

The integrated services digital network (hereinafter referred to as ISDN) can be regarded as a system for realizing various communications such as telephone, facsimile communication, data communication and image communication in a digitized network. In the conventional communication services before the ISDN, the interface between the terminal equipment of a user and the network is adapted only to a fixed one usage such as an interface for telephone, an interface for data communication, or the like. However, in the ISDN, an integrated interface for the above described various services is defined. The interface is called a multipurpose user network interface which is clearly defined by international telegraph and telephone consultative committee (hereinafter referred to as CCITT).

FIG. 3 is a diagrammatic view showing an example of a portion of the conventional ISDN. Referring to FIG. 3, in ISDN, the ISDN exchanges in a telephone station and the ISDN terminals in the user's premises are interconnected by a telephone network. A network termination unit 100 is provided in the user's premises, and the telephone network and the user's four-wire bus are connected to this termination unit 100. The ISDN terminals are connected via user's four-wire bus to the network termination unit 100. In the network termination unit 100, an interface circuit 101 is provided for connection with the user's four-wire bus.

FIG. 4A is a block diagram showing the interface circuit 101 provided in the network termination unit 100 shown in FIG. 3. Referring to FIG. 4A, the interface circuit 101 includes a driver 52 and a receiver 30 connected to the user's four-wire bus 61 and 62 respectively, frame buffers 51 and 53 connected to the driver 52 and receiver 30, a controller 55 for controlling the frame buffers 51 and 53 respectively and a reference voltage source 56 for supplying reference voltage $V_{ref}$ to the driver 52 and receiver 30. The digital signals supplied via the frame buffer 51 are converted by the driver into corresponding analog signals. On the other hand, the analog signals supplied via the user's four-wire bus 62 are converted into the digital form by the receiver 30 so as to be then supplied to the frame buffer 53.

In operation, digital data transmitted from a digital signal processing circuit (not shown) provided in the network termination unit 100 through a telephone network are applied to a frame buffer 51. The digital data are applied from the frame buffer 51 to a driver 52 for alternate mark inversion (hereinafter referred to as AMI). The driver 52 transmits the data which are turned into AMI codes to a user's ISDN terminal through a transmission bus line 61 in response to a digital signal. Meanwhile, a receiver 30 receives the AMI codes outputted from the ISDN terminal through a receiving bus 62. The receiver 30 detects digital data transmitted through the ISDN terminal in response to the received AMI codes. The digital data detected by the receiver 30 are applied to the frame buffer 53 and a PLL circuit 54 for error control. The digital data applied to the frame buffer 53 are applied to the digital signal processing circuit to be processed for transmission through the telephone network. The PLL circuit applies a control signal for error control to a controlling portion 55 in response to the digital data. The controlling portion 55 controls the above described operations in the interface circuit 101.

Referring to FIG. 4B, the network termination unit 100 and the ISDN terminals 70 are connected through user's 4-wire bus line 60 formed of a transmission bus 61 and a receiving bus 62. Sockets 73 are used for connecting the terminals 70 and buses 61 and 62. One ISDN terminal 70 comprises a receiver 71 connected to the bus 61 and a driver 72 connected to the bus 62. AMI coded data D1 and D2 of 48 bits for each frame are transmitted through the buses 61 and 62, respectively.

FIG. 5 is a waveform diagram showing examples of input and output signals supplied in the interface circuit shown in FIG. 4A via user's four-wire bus. As shown in FIG. 5, the signals coded by using AMI are transmitted via the user's four-wire bus between the network termination unit 100 and the ISDN terminal. As is apparent from FIG. 5, the binary data "0" is defined by a pulse having positive or negative polarity in the AMI. Meanwhile, the binary data "1" is defined by the absence of the pulse. In addition, the pulse polarity of the data "0" is determined by inverting the polarity of the directly proceeding "0". The DC level of the signals to be transmitted is not necessary when the AMI coding is used, so that alternate data transmission which is immune to the noises can be realized. The usage of the AMI coding is requested by the above mentioned CCITT for the ISDN.

FIG. 6 is a block diagram showing the receiver 30 shown in FIG. 4A. Referring to FIG. 6, the receiver 30 includes a filter section 31 connected for receiving signals from the user's four-wire bus, a peak hold or tracking circuit 32 connected to the output of the filter section 31, a data detector 33 connected to the output of the peak hold circuit 32, and an analog voltage generator 34 connected to receive the reference voltage $V_{ref}$ from the reference voltage source. The filter section 31 includes a low pass filter and a high pass filter. The peak hold circuit 32 receives the voltage signal Vin freed of noises by the filter section 31 and supplies a voltage corresponding to the peak voltage of the received signal to the data detector 33. The data detector 33 compares the voltage signal from the peak hold circuit 32 with the signal Vin from the filter section 31.

FIG. 7 is a circuit diagram showing an example of the conventional peak hold circuit shown in FIG. 6. The peak hold circuit shown in this figure may be seen for example in the Digest of Technical Papers, pages 108 and 109, in the IEEE International Solid State Circuits Conference held in 1988. It is noted that the example of the driver and receiver circuit shown in FIG. 4A is also reported in this Digest.

Referring to FIG. 7, the peak hold circuit 32 including an operational amplifier 1 having its non-inverting input connected for receiving the input voltage Vin, a MOS transistor 3 and a resistor 7 connected in series between the electrical source 10 and a reference voltage line 24, and a capacitor 5 connected in parallel with the resistor 7. The operational amplifier 1 has its inverting input connected to a common junction between the transistor 3 and the resistor 7. The transistor 3 has its gate connected to the output of the operational amplifier 1. The reference voltage line 24 is connected to the output of an operational amplifier 23 forming a voltage follower. The operational amplifier 23 is connected to an analog ground 19 to hold the reference voltage line 24 at an analog ground voltage Vag. The peak hold circuit 32 further includes an operational amplifier 2 having its non-inverting input connected for receiving the input voltage Vin, a resistor 8 and a PMOS transistor 4 connected in series between the reference voltage line 24 and the ground 11, and a capacitor 6 connected in parallel with the resistor 8. The operational amplifier 2 has its inverting input connected to a common junction between the resistor 8 and the transistor 4. The transistor 4 has its gate connected to the output of the operational amplifier 2.

The data detector 33 includes two comparators 20 and 21. The comparator 20 has its non-inverting input connected for receiving the input voltage Vin and has its inverting input connected for receiving a voltage Vth1 produced by voltage division by the resistor 7. The comparator 21 has its non-inverting input connected for receiving a voltage Vth2 obtained by voltage division by the resistor 8, and has its inverting input connected for receiving the input voltage Vin. The comparators 20 and 21 produce output voltages Vo1 and Vo2 indicating the respective results of comparison.

FIG. 8 is a timing chart for illustrating the operation of the peak hold circuit 32 shown in FIG. 7. The operation of the circuit is hereinafter explained by referring to FIGS. 7 and 8.

When a positive pulse is supplied as the input voltage Vin, transistor 3 is turned on. The capacitor 5 is charged by the voltage from the source potential 10 supplied via transistor 3. As the capacitor 5 is charged, transistor 3 is turned off gradually. Thus, a peak voltage Vpk1 corresponding to the peak value of the input voltage Vin is stored in the capacitor 5. The voltage Vth1 corresponding to the voltage Vpk1 held by the capacitor 5 is outputted after voltage division by the resistor 7. The voltage Vpk1 charged by the capacitor 5 is discharged via resistor 7 and reference voltage line 24. The discharge time constant is determined by the resistance of the resistor 7 and the capacitance of the capacitor 5. In general, the voltage Vpk1 and the output voltage Vth1 reach the analog ground voltage Vag before the next positive pulse is supplied.

On the other hand, when a negative pulse is supplied as the input voltage Vin, the peak voltage Vpk2 is held in the capacitor 6 in the same way as above. Thus the voltage Vth2 corresponding to the peak voltage Vpk2 is outputted via resistor 8.

Generally, the distances between the network termination unit and the each of the ISDN terminals connected through the user's 4-wire bus line are different, so that the voltage level Vin of the input signals of the peak hold circuit 32 changes corresponding to the terminals through which the input signals are transmitted. Consequently, the data detector 33 shown in FIG. 7 cannot detect exactly the transmitted data when a fixed threshold value is used as a reference level. Therefore, the peak hold circuit 32 generates variable threshold voltages Vth1 and Vth2 in response to the input voltage Vin. Referring to FIG. 9, peak voltages Vpk1 and Vpk2 and threshold voltages Vth1 and Vth2 provided based on input voltages Vin having different amplitudes and polarities are shown. The comparators 20 and 21 in the data detector 33 compare the input voltages Vin with the voltages Vth1 and Vth2 outputted from the peak hold circuit 32 as a reference voltages, respectively. Therefore, even if various voltage levels of the input signals are applied, the data detector 33 can exactly detect the transmitted data.

In the conventional peak hold circuit, when minute voltage fluctuations are contained in the input voltage Vin, the following problems are presented. That is, when an input voltage Vin effective as the input signal is not supplied, a back pulse A or noise B as shown in FIG. 8 are occasionally contained in the input signal Vin. The back pulse A is generated by, for example, a mismatch between an impedance of a bus line and an output impedance of a driver circuit in a transmitter of the input signal. In addition, the pulse signals on the bus line often include overshoot and undershoot which are the causes of the back pulse A. In addition, overshoot and the undershoot are sometimes generated in the input circuits provided in a semiconductor chip, for example, in the input buffer, the low pass filter and the like. Meanwhile, the noise B is generated mainly by the capacitive coupling between the interconnection in the semiconductor chip for transmitting the input voltage Vin and other interconnections. In such a case, the conventional peak hold circuit 32 operates responsive to the minute voltage fluctuations contained in the input voltage Vin. Thus the mistaken output voltages Vth1 and Vth2, in other words, the output voltage which should have not been outputted, are outputted by the peak hold circuit 32, so that the data detector 33 also outputs mistaken output voltages Vo1 and Vo2.

Also, when no input voltage Vin is supplied, the voltage Vin and the voltages Vth1 and Vth2 reach the analog ground voltage Vag. Hence, when the comparators 20 and 21 include offset voltages, the comparators 20 and 21 occasionally operate in a mistaken manner. The offset voltage of the comparator is generally generated by the different between the characteristics of the two transistors in the comparator to which two differential input terminals are connected. More specifically, the offset voltage is generated by the different between the threshold voltages of the two transistors and the differences in the voltage amplification rates thereof.

SUMMARY OF THE INVENTION

It is an object of the present invention to provide a peak hold circuit in which the output voltage of the circuit is prevented from being affected by the minute voltage fluctuations contained in the input voltage.

It is another object of the present invention to provide a peak hold circuit in which the output voltage of the circuit is prevented from being affected by back pulses or noises contained in the input signals.

It is a further object of the present invention to provide a peak hold circuit which stabilized in operation.

It is yet another object of the present invention to provide a peak hold circuit in which voltage fluctuations of various levels contained in the input signals may be dealt with successfully.

It is still another object of the present invention to provide a signal detection circuit in which the output is immune to a variation in comparator offset.

Briefly stated, a signal detection circuit of the present invention comprises a comparator circuit connected such that a first input terminal receives a pulse signal having a variable amplitude on an incoming signal line. The signal detection circuit further comprises a circuit for generating a first reference voltage having an amplitude proportional to respective peak voltages of the incoming pulse signals, a circuit for generating a second reference voltage having an amplitude a little larger than the amplitude of the voltage fluctuation possible on the incoming signal line, and a circuit for outputting a third reference voltage by shifting the amplitude of the first reference voltage in response to the second reference voltage. The comparator circuit is connected such that a second input terminal receives the third reference voltage.

In operation, the comparator circuit compares the voltage level of a pulse signal on the incoming signal line applied through the first input terminal with the third reference voltage level applied through the second input terminal. Since the third reference voltage is obtained in response to the second reference voltage which is in turn provided based on the amplitude of the voltage fluctuation on the incoming signal, the output signal of the comparator circuit is free from the voltage fluctuation on the incoming signal line.

In another aspect, the signal detection circuit in accordance with the present invention is provided for detecting a pulse signal having variable amplitude on the incoming signal line. On the incoming signal line, voltage fluctuations smaller than the pulse signals are apt to be generated. The signal detection circuit comprises a comparator circuit having first and second input terminals. A method for operating the signal detecting circuit comprises the step of applying data signals on the incoming signal line to a first input terminal of the circuit, generating a first reference voltage having an amplitude proportional to respective peak voltages of the incoming pulse signals, generating a second reference voltage having an amplitude a little larger than the amplitude of the fluctuation of the voltage, providing a third reference voltage by shifting the amplitude of the first reference voltage in response to the second reference voltage, and applying the third reference voltage to the second input terminal of the comparator circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
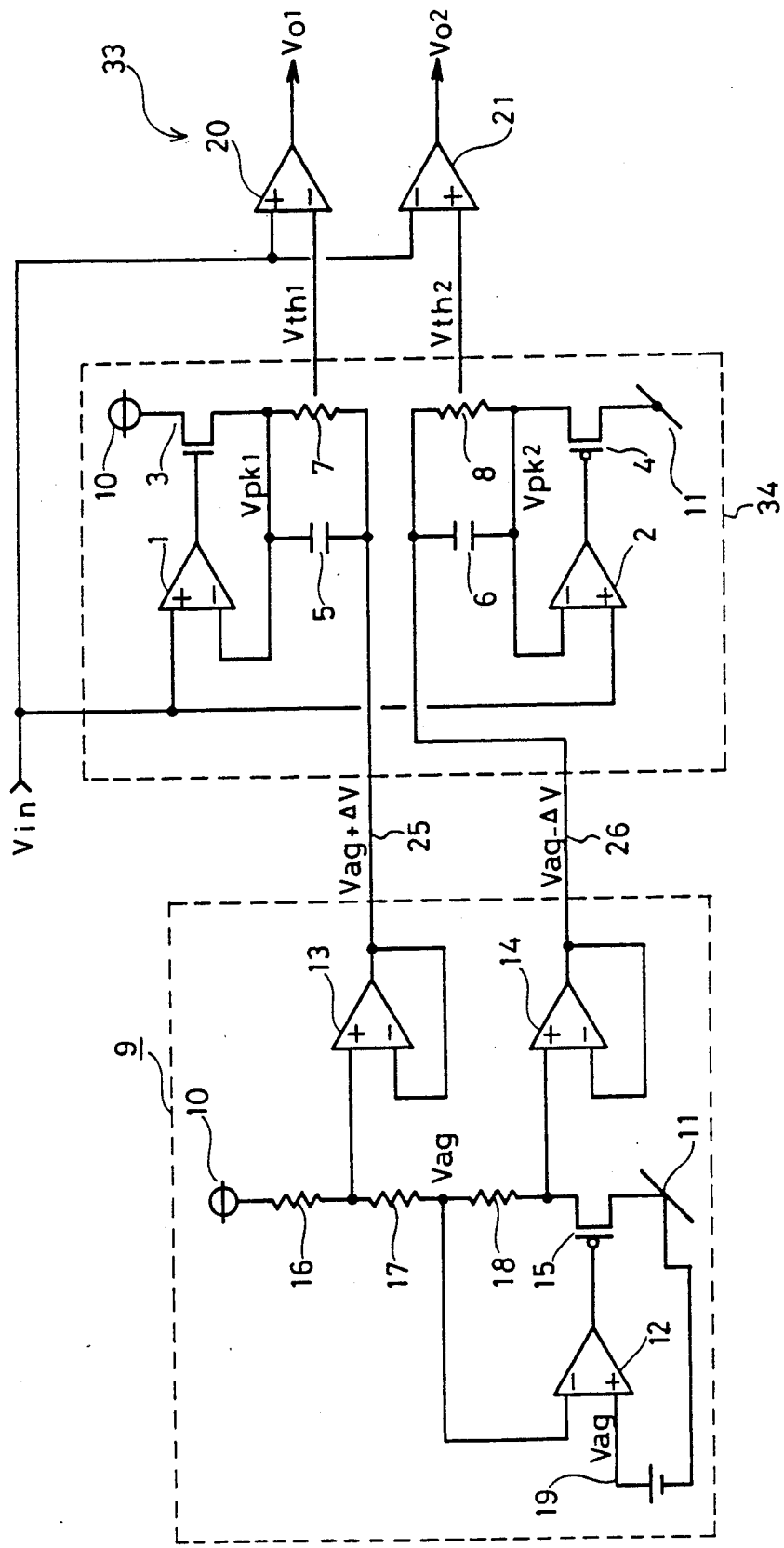
FIG. 1 is a circuit diagram of a peak hold circuit showing an embodiment of the present invention.

Referring to FIG. 1, a peak hold or tracking circuit 34 includes two reference voltage lines 25 and 26. A reference voltage generating circuit 9 for supplying a reference voltage to the reference voltage lines 25 and 26 is connected to the peak hold circuit 34 via reference voltage lines 25 and 26.

The peak hold or tracking circuit 34 includes an operational amplifier 1 having its non-inverting input connected for receiving the input voltage Vin, an NMOS transistor 3 and the resistor 7 connected in series between the source potential 10 and the reference voltage line 25, and a capacitor 5 connected in parallel with the resistor 7. The operational amplifier 1 has its inverting input connected to a common junction point between the transistor 3 and the resistor 7. The transistor 3 has its gate connected to the output of the operational amplifier 1. The peak hold circuit 34 also includes an operational amplifier 2 having its non-inverting input connected for receiving the input voltage Vin, a resistor 8 and a PMOS transistor 4 connected in series between the reference voltage line 26 and the ground potential 11 and a capacitor 6 connected in parallel with resistor 8. The operational amplifier 2 has its inverting input connected to a common junction point between the resistor 8 and the transistor 4. The transistor 4 has its gate connected to the output of the operational amplifier 2.

A data detector 33 includes comparators 20 and 21. The comparator 20 has its non-inverting input connected for receiving the input voltage Vin and its inverting input connected for receiving the output voltage Vth1 of the peak hold circuit 34. The comparator 21 has its non-inverting input connected for receiving the output voltage Vth2 of the peak hold circuit 34 and its inverting input connected for receiving the input voltage Vin.

The reference voltage generating circuit 9 includes resistors 16, 17, and 18 and a PMOS transistor 15 connected in series between the source potential 10 and the ground potential 11, and operational amplifiers 12 to 14. The operational amplifier 12 has its non-inverting input connected to an analog ground 19, its inverting input connected to a common junction point between the resistors 17 and 18 and its output connected to the gate of a transistor 15. The transistor 15 and the operational amplifier 12 make up a constant current source. The operational amplifier 13 has its non-inverting input connected to a common junction point between the resistors 16 and 17 and its inverting input and output connected together. The operational amplifier 14 has its non-inverting input connected to a common junction point between the resistor 18 and the transistor 15 and has its inverting input and output connected together. Hence, the operational amplifiers 13 and 14 each constitute a voltage follower and act as a buffer amplifier.

The voltages on the reference voltage lines 25 and 26 are determined by the reference voltage generating circuit 9. Thus, the reference voltage line 25 is brought to a voltage higher by $\Delta V$ than the analog ground voltage Vag by the reference voltage generating circuit 9. On the other hand, the reference voltage line 26 is brought to a voltage lower by $\Delta V$ than the analog ground voltage Vag. The value of the voltage $\Delta V$ is set to a value exceeding the minute voltage fluctuations occasionally contained in the input voltage. The setting of the voltage $\Delta V$ is by a voltage dividing circuit made up of the resistors 16, 17 and 18 and the transistor 15. The operation amplifiers 13 and 14 constituting the voltage followers toward the voltage Vag$\pm\Delta V$ outputted from the voltage dividing circuit, respectively.

Figure 2A:
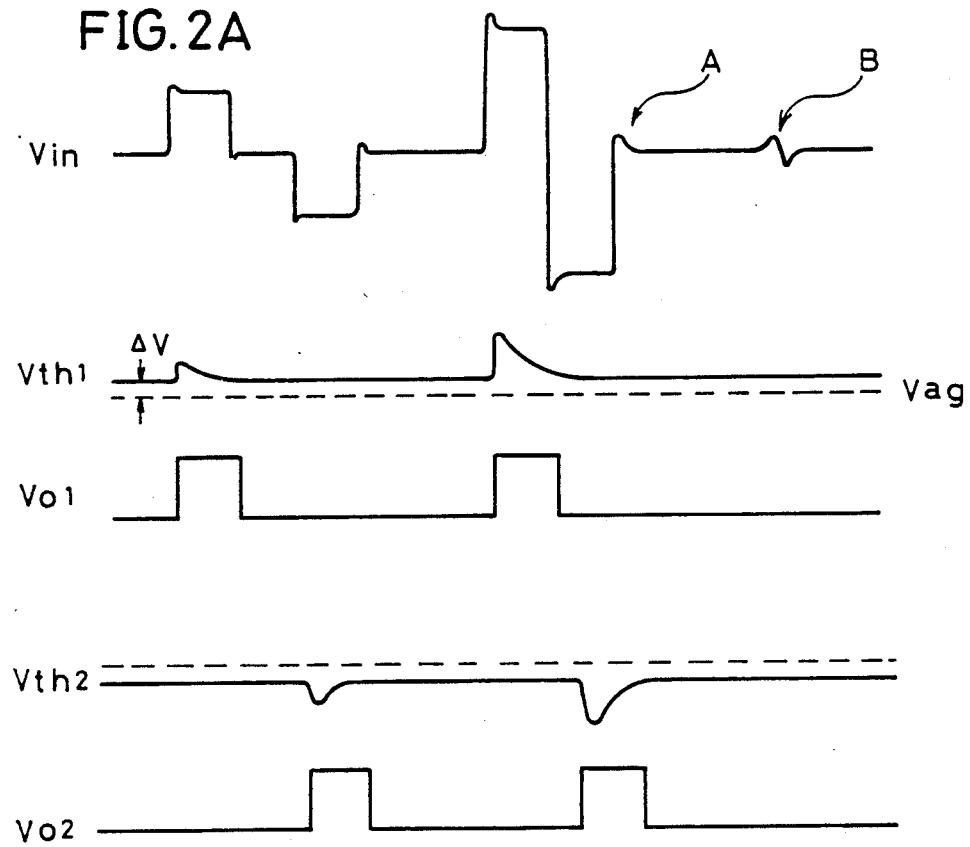
FIG. 2A is a timing chart for illustrating the operation of the peak hold circuit shown in FIG. 1.
Figure 8:
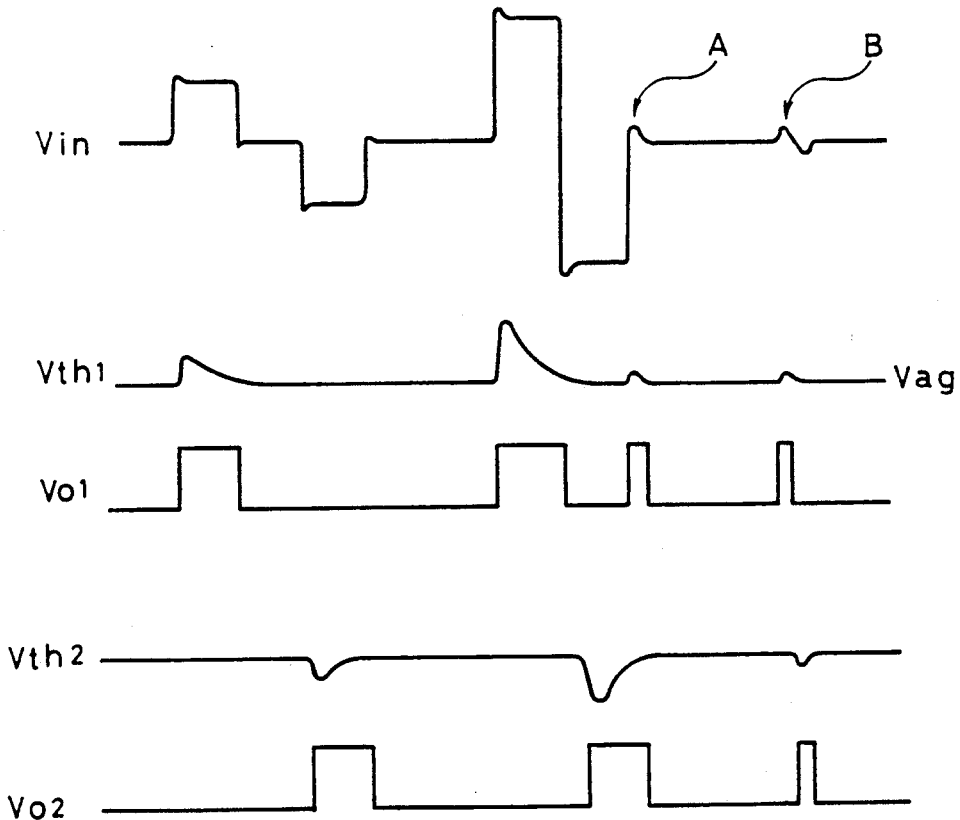
FIG. 8 is a timing chart for illustrating the operation of the peak hold circuit shown in FIG. 7.

The operation of the peak hold circuit is hereinafter explained by referring to FIGS. 1 and 2A. When a positive pulse is applied as the input voltage Vin, transistor 3 is turned on. Hence, the capacitor 5 is charged by a voltage from the source potential 10 supplied via transistor 3. As the charging proceeds by the capacitor 5, the transistor 3 is turned off gradually. The peak voltage Vpk1 corresponding to the peak value of the input voltage Vin is charged in the capacitor 5. The voltage Vpk1 is divided by voltage division by the resistor 7 and outputted as the voltage Vth1.

Although the peak-hold operation proceeds as conventionally, attention should be directed to the following operation. That is, since the reference voltage line 25 is brought to a voltage higher $\Delta V$ than the analog ground voltage Vag, the peak voltage Vpk1 and the output voltage Vth1 are not lowered to a level not higher than the voltage Vag+$\Delta V$. Therefore, when the voltage Vin effective as an input signal is not applied, the adverse effects of the back pulse A or the noise B occasionally contained in the input voltage Vin as shown in FIG. 2A are not reflected in the output voltage Vth1. As a result, an output voltage Vo1 indicating the accurate comparison results is outputted from the comparator 20.

On the other hand, when a negative pulse is applied as the input voltage Vin, the circuit having the voltage on the reference voltage line 26 as a reference voltage operates in the similar manner so that the accurate voltage Vo2 is outputted from the comparator 21. In this case, the peak voltage Vpk2 charged by the capacitor 6 and the output voltage Vth2 are not increased to higher than voltage Vag $-\Delta V$.

In other words, when the input voltage Vin is within the range of the voltage Vag$\pm\Delta V$, the relative magnitude of the voltages supplied to the inverting input and non-inverting input of each of the operational amplifiers 1 and 2 is not changed. Therefore, the effects caused by the minute voltage fluctuations are not reflected in the output voltages Vth1 or Vth2. As a result, the voltage signals Vo1 and Vo2 indicating the accurate detection results may be outputted by the data detector 33.

It is noted that, in the circuit shown in FIG. 1, when a pulse effective as the input signal is not supplied thereto, a voltage at the level of the analog ground voltage Vag is supplied thereto as the input voltage Vin. At this time, the peak hold circuit 34 outputs a voltage Vag+$\Delta V$ as the output voltage Vth1 and a voltage Vag$-\Delta V$ as the output voltage Vth2. Therefore, even when an offset voltage is established in the comparators 20 and 21 of the data detector 33, the comparators 20 and 21 output correct comparison results, as long as the offset voltage is less than the voltage $\Delta V$.

The setting of the voltage $\Delta V$ is hereinafter explained. Basically, the voltage $\Delta V$ is set so as to be larger than the extent of the voltage fluctuations contained in the input voltage Vin and exceedingly lesser than the minimum value of the input voltage Vin effective as the input signal.

With the ratio of voltage division at the resistor 7 being given as 1/n, the output voltage Vth1 is expressed by the following formula;

$$Vth1 = \Delta V + (Vin - \Delta V)/n \ldots \quad (1)$$

As may be seen from the formula (1), if the voltage $\Delta V$ is set to an excessively large value, it is necessary to set the ratio 1/n to a lesser value, so that the voltage Vth1 becomes approximately constant. Thus, the advantage derived from the variable voltage Vth1 is lost.

Figure 2B:
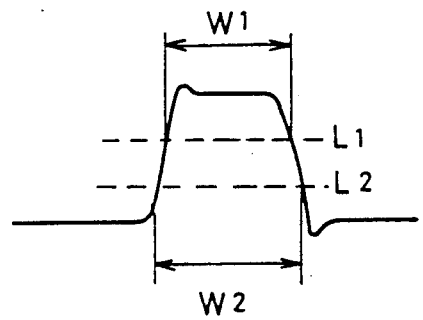
FIG. 2B is a waveform diagram showing the relation between the pulse widths of the input voltage and output voltage of the comparator shown in FIG. 1.
Figure 3:
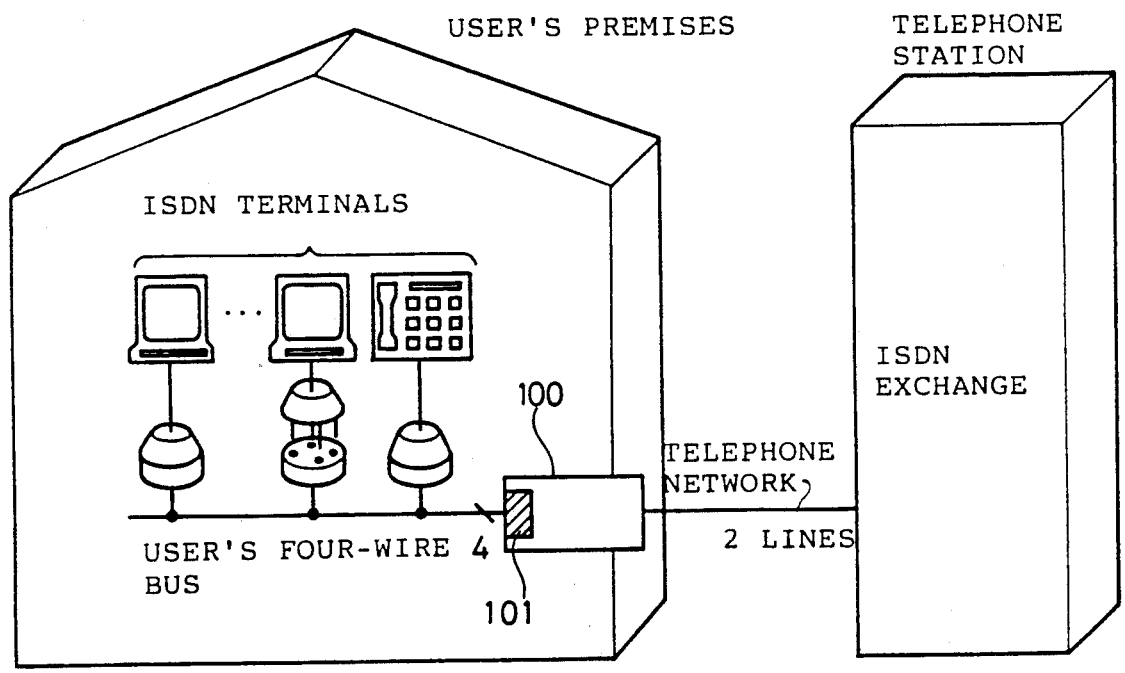
FIG. 3 is a diagrammatic view showing an example of a portion of the conventional integrated services digital network.
Figure 4A:
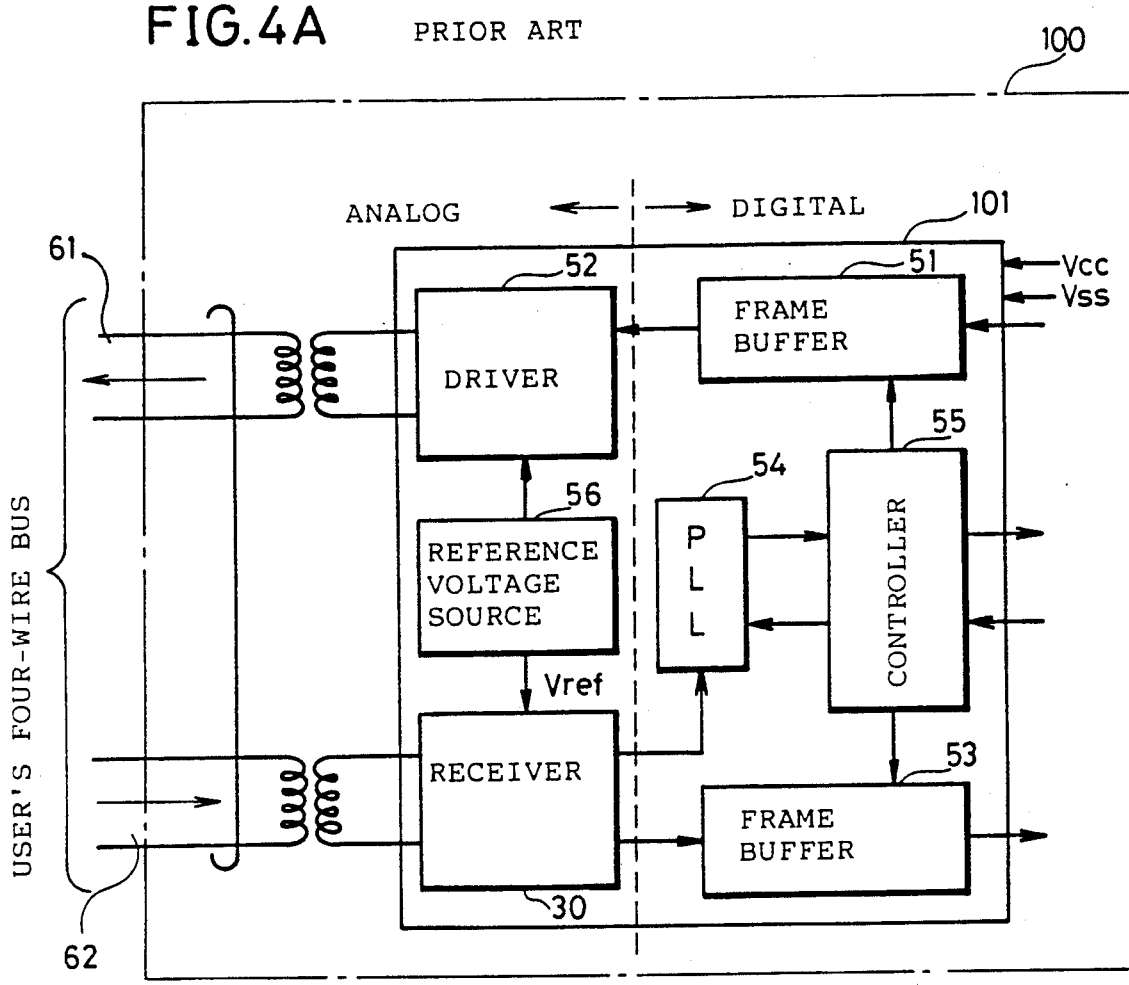
FIG. 4A is a block diagram showing an interface circuit provided in a network termination unit shown in FIG. 3.
Figure 4B:
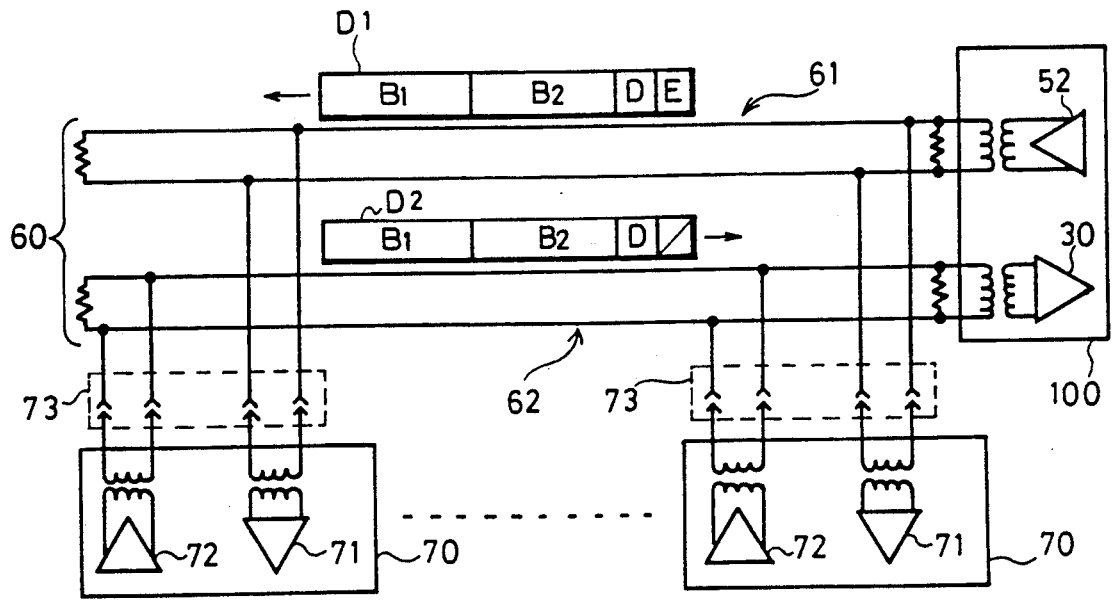
FIG. 4B is a schematic block diagram illustrating the users 4-wire bus line connected between the network termination unit and the ISDN terminals.
Figure 5:
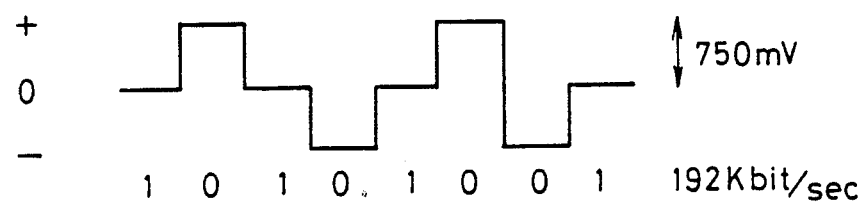
FIG. 5 is a waveform diagram showing an example of input and output signals of an interface circuit shown in FIG. 4.
Figure 6:
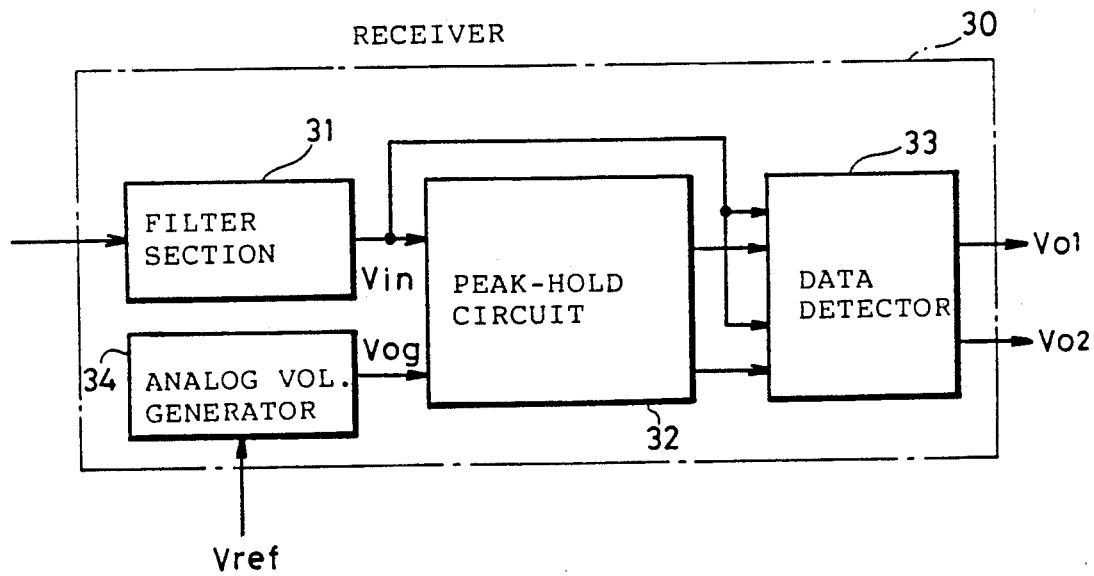
FIG. 6 is a block diagram showing a receiver shown in FIG. 4.
Figure 7:
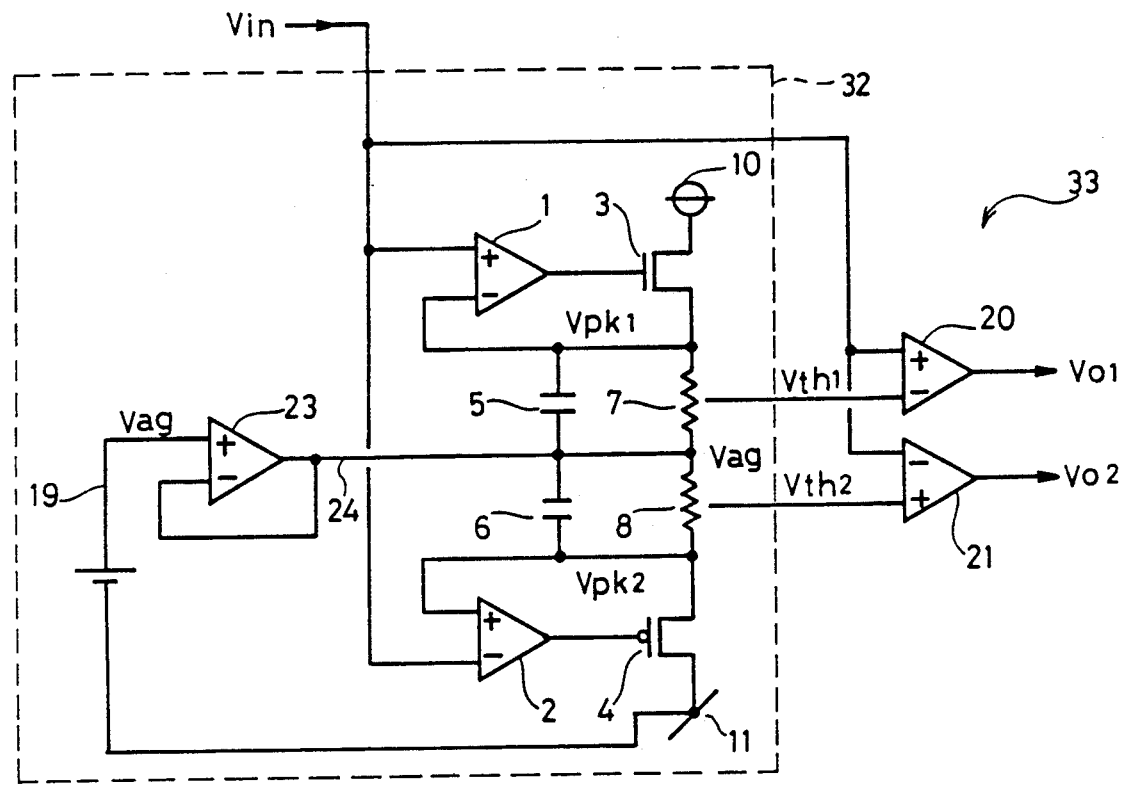
FIG. 7 is a circuit diagram showing an example of a conventional peak hold circuit shown in FIG. 6.
Figure 9:
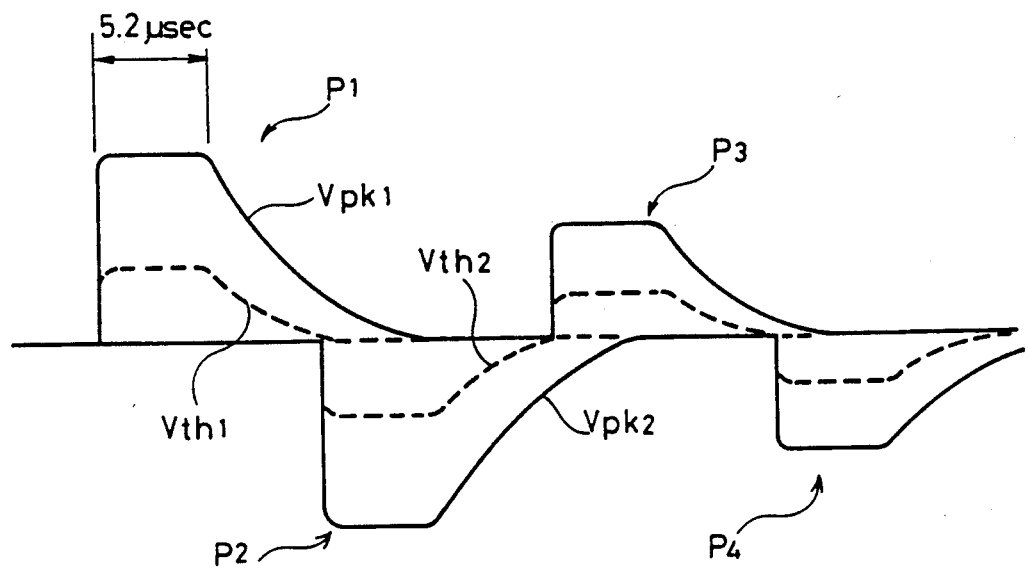
FIG. 9 is a diagram of waveforms illustrating the operation of the peak hold circuit shown in FIG. 7.

FIG. 2B is a waveform diagram showing the relation between the pulse width of the input and output voltages of the comparator 20 shown in FIG. 1. As shown in FIG. 2B, when the output voltage Vth1 is set to a higher value, the comparison level is at L1 so that the pulse width W1 of the output voltage becomes narrow. Conversely, when the output voltage Vth1 is set to a lesser value, the comparison level is at L2, so that the output voltage having a wider pulse width W2 is obtained. In accordance with a specification or a standard of the ISDN, 5.2 $\mu$sec is required for the 1 bit pulse width. In order to satisfy this requirement, the level of comparison, that is, the threshold voltages Vth1 and Vth2 outputted from the peak hold circuit 32 are adjusted by the resistances 7 and 8.

The above described conditions and the margin of the input voltage Vin have been taken into consideration in carrying out a simulation, which has led to the following desirable example of the setting value. That is, V=125 mV, and 1/n=1/5. Thus, by using a circuit having these setting values, a peak hold circuit has been produced which is less susceptible to noise.

It will be seen from the foregoing that the voltages on the reference voltage lines 25 and 26 may be set to desired values by voltage division at the reference voltage generating circuit 9 shown in FIG. 1, so that it becomes possible to deal with minute voltage fluctuations of various levels, such as back pulse A and noise B, contained in the input signals. In addition, the voltages on the reference voltage lines 25 and 26 are each held by the operational amplifiers 13 and 14 constituting a voltage follower, so that the operation of the peak hold circuit 34 is stabilized. As shown in FIG. 1, the peak hold circuit 34 is provided with the reference voltage generating circuit 9 for supplying the reference voltage Vag$\pm\Delta V$, so that the output voltages Vth1 and Vth2 of the peak hold circuit 34 are not affected by the minute voltage fluctuations contained in the input voltage. Therefore, in response to the input signal Vin in accordance with the alternate mark inversion, exact data which is not influenced by the minute voltage fluctuation can be detected by the data detector 33.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal detection circuit for detecting pulse signals, having a variable magnitude, on an incoming signal line whereon voltage fluctuations, smaller than said pulse signals, tend to occur, said signal detection circuit comprising:
   comparator means having first and second input terminals for generating an output signal;
   means for applying data signals on said incoming signal line to said first input terminal of said comparator means;
   means for generating a first reference voltage having a magnitude proportional to each peak voltage of said incoming pulse signals;
   means for generating a second reference voltage having a magnitude slightly greater than the magnitude of said voltage fluctuations;
   means, responsive to said second reference voltage, for shifting the magnitude of said first reference voltage and generating a third reference voltage; and
   means for applying said third reference voltage to said second input terminal of said comparator means.

2. The signal detection circuit according to claim 1, wherein said second reference voltage generating means includes:
   voltage setting means for setting said second reference voltage, and
   voltage holding means connected to said voltage setting means for holding a voltage set by said voltage setting means.

3. A signal detecting circuit according to claim 1, wherein said means for generating a first reference voltage comprises:
   difference detection means for detecting difference between a voltage at an node, at the output of said difference detection means, and voltages of said incoming pulse signals, and
   charging means responsive to the difference detection means for charging said node.

4. A signal detection circuit according to claim 1, wherein
   said means for generating said third reference voltage comprises capacitance means and resistance means connected in parallel between nodes at the output of said means for generating first and second reference voltages, and
   said third reference voltage is outputted through said resistance means.

5. The signal detection circuit according to claim 2, wherein said voltage setting means includes voltage dividing means connected between a source potential and a ground potential for dividing the source voltage.

6. The signal detection circuit according to claim 2, wherein said voltage holding means includes a voltage follower type buffer amplifier means connected to the output of said voltage setting means.

7. The signal detection circuit according to claim 6, wherein
   said buffer amplifier means include an operational amplifier having an inverting input, non-inverting input and an output, and wherein
   said operational amplifier has its non-inverting input connected to the output of the voltage setting means and its inverting input and output connected together.

8. A signal detection circuit according to claim 1, wherein said incoming pulse signals having variable amplitude comprise signals modulated in accordance with a predetermined alternate mark inversion.

9. A method of operating a signal detection circuit for detecting pulse signals having variable amplitude on an incoming signal line, voltage fluctuation smaller than said pulse signals tend to occur on said incoming signal, said signal line detection circuit including comparator means having first and second input terminals for generating an output signal, said method comprising the steps of:
   applying data signals on said incoming signal line to said first input terminal of said comparator means;
   generating a first reference voltage having a magnitude proportional to each peak voltage of said incoming pulse signals;
   generating a second reference voltage having a magnitude slightly greater than the magnitude of said voltage fluctuation;
   obtaining a third reference voltage by shifting the magnitude of said first reference voltage in response to said second reference voltage; and
   applying said third reference voltage to the second input terminal of said comparator means.

* * * * *